(12) United States Patent
Ogawa et al.

(10) Patent No.: US 8,395,422 B2
(45) Date of Patent: Mar. 12, 2013

(54) DRIVE CIRCUIT FOR SWITCHING DEVICE

(75) Inventors: Kazutoshi Ogawa, Hitachi (JP); Katsumi Ishikawa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 68 days.

(21) Appl. No.: 12/893,356

(22) Filed: Sep. 29, 2010

(65) Prior Publication Data

US 2011/0080192 A1   Apr. 7, 2011

(30) Foreign Application Priority Data

Oct. 2, 2009   (JP) .................................. 2009-230133

(51) Int. Cl.
*H03B 1/00*   (2006.01)
*H03K 3/00*   (2006.01)

(52) U.S. Cl. ..................... 327/109; 108/111; 108/112

(58) Field of Classification Search .......... 327/108–112, 327/365–508; 326/22–27, 81–87
See application file for complete search history.

(56) References Cited

U.S. PATENT DOCUMENTS

| | | | |
|---|---|---|---|
| 5,001,373 A | | 3/1991 | Bator et al. |
| 5,079,608 A | * | 1/1992 | Wodarczyk et al. .......... 257/355 |
| 5,434,527 A | * | 7/1995 | Antone .......................... 327/391 |
| 5,581,131 A | | 12/1996 | Urushiwawra et al. |
| 5,818,281 A | * | 10/1998 | Ohura et al. .................. 327/381 |
| 6,385,028 B1 | | 5/2002 | Kouno |
| 2002/0109186 A1 | * | 8/2002 | Kanekawa et al. ............ 257/347 |
| 2003/0075748 A1 | * | 4/2003 | Furuie et al. .................. 257/296 |
| 2004/0041201 A1 | * | 3/2004 | Sugiyama et al. ............ 257/316 |
| 2004/0075103 A1 | * | 4/2004 | Topp et al. .................... 257/130 |
| 2006/0113593 A1 | | 6/2006 | Sankin et al. |
| 2009/0066404 A1 | * | 3/2009 | Heppenstall et al. ......... 327/513 |
| 2010/0224885 A1 | * | 9/2010 | Onose ............................. 257/77 |

FOREIGN PATENT DOCUMENTS

| | | |
|---|---|---|
| DE | 4300953 | 7/1993 |
| DE | 1992/7727 | 12/1999 |
| JP | 2000-243905 | 9/2000 |
| JP | 2004-14547 | 1/2004 |
| JP | 2007-215389 | 8/2007 |
| WO | WO 2006/060337 | 6/2006 |

OTHER PUBLICATIONS

Extended European Search Report issued in European Patent No. 10251679.6-1233/2306647 dated Jul. 12, 2011, (10 pages).
Partial European Search Report issued in European Patent No. 10251679.6 on Feb. 4, 2011.

* cited by examiner

*Primary Examiner* — Lincoln Donovan
*Assistant Examiner* — Brandon S Cole
(74) *Attorney, Agent, or Firm* — Antonelli, Terry, Stout & Kraus, LLP.

(57) ABSTRACT

The threshold value for a normally-off junction FET is a low value. Accordingly, in a semiconductor driver circuit using the normally-off junction FET, there have existed such problems as high-accuracy voltage control, high-speed charging into an input capacitor, and misoperations. A semiconductor driver circuit which is the most suitable for the normally-off junction FET is proposed by applying the high-accuracy gate-voltage generation scheme based on a Zener diode, a reduction in the turn-on loss based on a speed-up capacitor, the connection of an inter-gate-source capacitor, and a misoperation-preventing circuit based on the source-terminal optimum implementation scheme.

9 Claims, 7 Drawing Sheets

DRIVE CIRCUIT FOR SWITCHING DEVICE

BACKGROUND OF THE INVENTION

The present invention relates to d drive circuit for switching device and a semiconductor driver circuit of a normally-off junction FET, and a semiconductor device using the same.

A wide band-gap semiconductor element, which employs a wide band-gap material such as silicon carbide (SiC), gallium nitride (GaN), or diamond, exhibits excellent characteristics as a switching element. Here, examples of such a wide band-gap semiconductor element are as follows: Junction FET (JFET), Static Induction Transistor (SIT), MEtal-Semiconductor Field Effect Transistor (MESFET), Hetero junction Field Effect Transistor (HFET), and High Electron Mobility Transistor (HEMT). Also, in the junction FET having normally-off characteristics, even if a malfunction of a circuit has occurred, e.g., even if a gate driver circuit has failed, the short-circuit and failure can be prevented.

The normally-off junction FET is represented by and is equivalent to an equivalent circuit in which a parasite diode is connected in parallel to an input capacitor between the gate and the source. On account of this fact, in the case of the junction FET which employs SiC, the threshold value for turning on the switching element becomes equal to about 2.5 V, which is a significantly low value. Accordingly, in the normally-off junction FET, there have existed problems such as high-accuracy voltage control, high-speed charging into the input capacitor, and misoperations.

The inter-gate-source characteristics of the junction FET become the forward-direction characteristics of the diode. On account of this fact, applying thereto a voltage which is higher than the rise-up voltage causes a large gate current to continue flowing. As a result, power consumption by the gate driver circuit has increased.

Also, the threshold value is low, and thus the large gate voltage cannot be applied thereto at the time of turn-on. On account of this fact, the input capacitor cannot be charged at a high speed. As a result, the turn-on loss has increased.

Also, the noise-resistant amount is small, and thus a possibility of giving rise to occurrence of the misoperations is high. As a result, there have occurred, e.g., the self turn-on phenomenon and a misoperation at the time of turn-off.

Moreover, in the conventional technologies disclosed in JP-A-2000-243905 and JP-A-2004-14547, the proposal has been made concerning a technique for preventing the misoperation due to the self turn-on phenomenon by connecting a capacitor between the gate and the source. No description, however, has been given regarding the misoperation at the time of turn-off. Also, the conventional technologies relate to a driver circuit that uses an IGBT (Insulated-Gate Bipolar Transistor) whose threshold value is higher as compared with the normally-off junction FET. Namely, no description has been given concerning a circuit for driving a low-threshold-value element with a low loss.

SUMMARY OF THE INVENTION

As having been described so far, in the semiconductor driver circuit using the normally-off junction FET, there have existed the problems such as high-accuracy voltage control, high-speed charging into the input capacitor, and misoperations.

It is an object of the present invention to provide a semiconductor driver circuit for preventing the misoperations from occurring as much as possible, and allowing implementation of the low-loss driving even in the case where the normally-off junction FET is used, and a semiconductor device using this semiconductor driver circuit.

In order to solve the above-described problems, in the present invention, there is provided a semiconductor driver circuit including a semiconductor switching element including a drain terminal, a source terminal, and a gate terminal, and a gate driver circuit for controlling voltages of the source terminal and the gate terminal of the semiconductor switching element, wherein the gate driver circuit controls a voltage into a range of 2.5 V to 3.5 V, the voltage being applied between the gate terminal and the source terminal when the semiconductor switching element is turned on by the gate driver circuit.

Also, in order to solve the above-described problems, in the present invention, there is provided a semiconductor driver circuit including a semiconductor switching element including a drain terminal, a source terminal, and a gate terminal, and a gate driver circuit for controlling voltages of the source terminal and the gate terminal of the semiconductor switching element, wherein a Zener diode and a diode are provided between the source terminal and the gate terminal, the Zener diode and the diode being connected to each other in series, an anode terminal of the Zener diode being connected to the source terminal, and an anode terminal of the diode being connected to the gate terminal.

Furthermore, in the present invention, in the semiconductor driver circuit, the reverse-blocking voltage of the Zener diode is equal to 2V or more.

Furthermore, in the present invention, in the semiconductor driver circuit, a gate resistor for adjusting speeds of turn-on and turn-off of the semiconductor switching element is provided inside the gate driver circuit, a first capacitor being connected to the gate resistor in parallel thereto, capacitance value of the first capacitor being larger than capacitance value of an input capacitor of the semiconductor switching element.

Furthermore, in the present invention, in the semiconductor driver circuit, the magnitude of resistance value of the gate resistor and the magnitude of the capacitance value of the first capacitor are changed between the turn-on time and the turn-off time of the semiconductor switching element.

Furthermore, in the present invention, in the semiconductor driver circuit, a second capacitor is provided between the source terminal and the gate terminal.

Furthermore, in the present invention, there is provided a semiconductor device including a substrate, the semiconductor driver circuit and the semiconductor switching element being implemented on the substrate, and a package for the substrate, wherein the second capacitor is implemented on the substrate.

Furthermore, in the present invention, there is provided a semiconductor device including the semiconductor driver circuit, a substrate, a gate-driver-circuit-dedicated power-supply, a main-circuit power-supply, a load terminal, and the semiconductor switching element being implemented on the substrate, and a package for the substrate, wherein a first source wiring and a second source wiring are connected to a source electrode of the semiconductor switching element, the first source wiring being connected to a negative terminal of the gate-driver-circuit-dedicated power-supply, the second source wiring being connected to a negative terminal of the main-circuit power-supply, or the load terminal.

Furthermore, in the present invention, in the semiconductor driver circuit, the semiconductor switching element is a normally-off junction FET which employs a wide band-gap semiconductor such as silicon carbide, gallium nitride, or diamond.

According to the present invention, it becomes possible to implement the provision of a semiconductor driver circuit for preventing the misoperations from occurring as much as possible, and allowing implementation of the low-loss driving even in the normally-off junction FET whose gate voltage's threshold value is low, and a semiconductor device using this semiconductor driver circuit.

Other objects, features and advantages of the invention will become apparent from the following description of the embodiments of the invention taken in conjunction with the accompanying drawings.

DESCRIPTION OF THE EMBODIMENTS

Hereinafter, referring to the drawings, the explanation will be given below concerning embodiments of the present invention.

<<Embodiment 1>>

Figure 1:
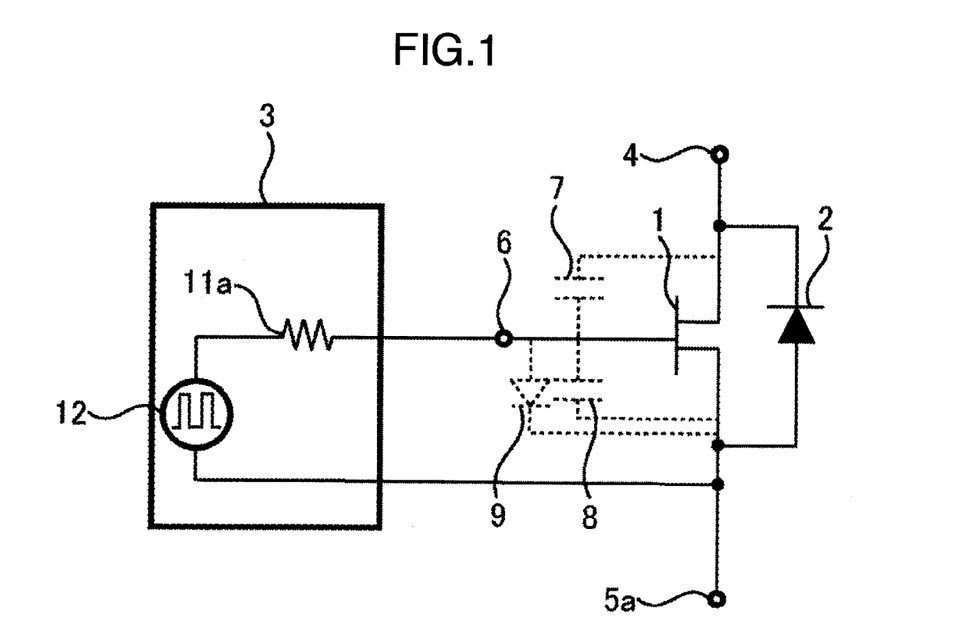
FIG. 1 is an explanatory diagram for explaining a semiconductor driver circuit in a first embodiment.
Figure 2:
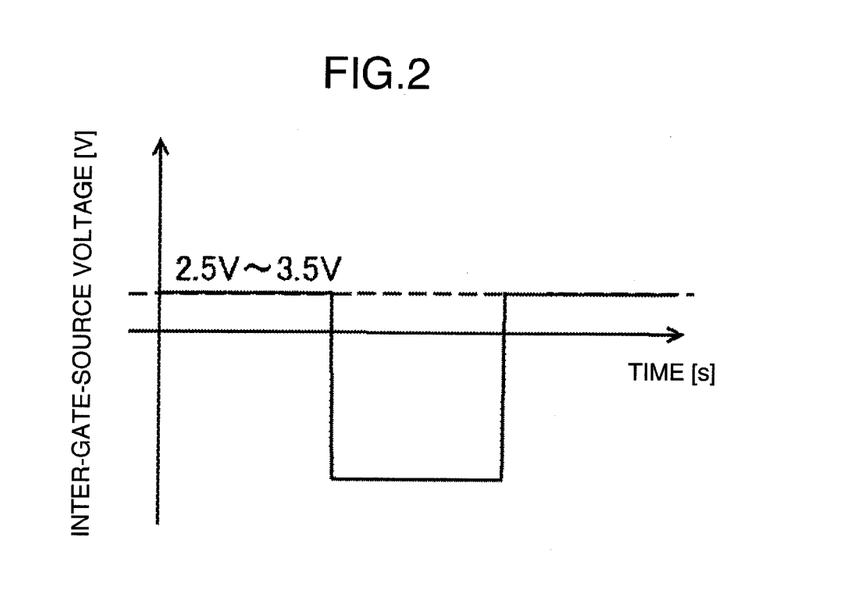
FIG. 2 illustrates the inter-gate-source voltage of the semiconductor driver circuit in the first embodiment.
Figure 3:
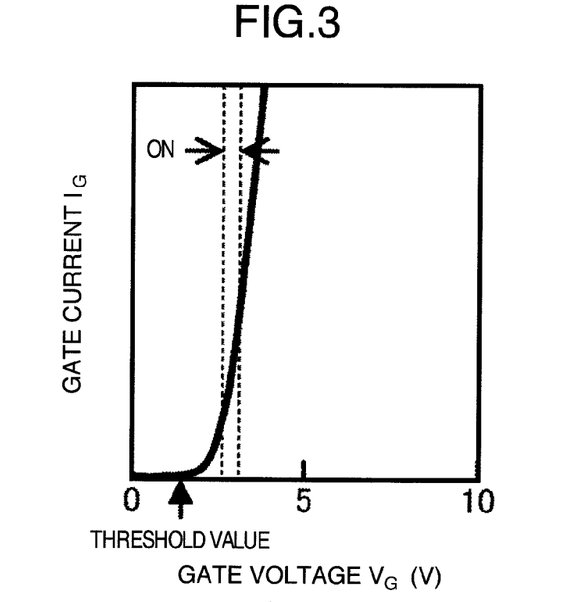
FIG. 3 illustrates the inter-gate-source characteristics of the normally-off junction FET.
Figure 4:
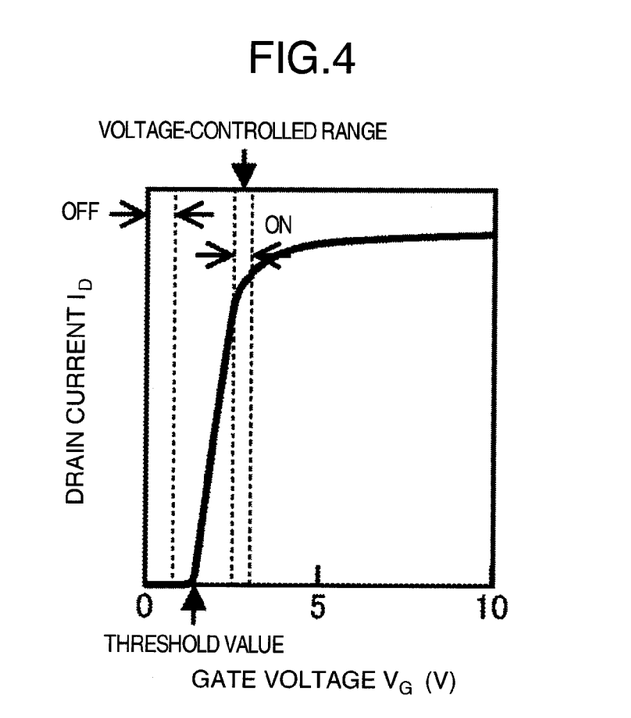
FIG. 4 illustrates gate-voltage-vs.-drain-current characteristics of the normally-off junction FET.

FIG. 1 illustrates a first embodiment of the present invention. FIG. 2 illustrates the inter-gate-source voltage in the first embodiment in FIG. 1. FIG. 3 illustrates the inter-gate-source forward-direction characteristics of the normally-off junction FET. FIG. 4 illustrates gate-voltage-vs.-drain-current characteristics of the normally-off junction FET.

The configuration of the present embodiment is as follows: The normally-off junction FET 1 is connected between a drain terminal 4 and a source terminal 5. A gate driver circuit 3 is connected between the source terminal 5 and a gate terminal 6 of the junction FET 1. The gate driver circuit 3 is constituted from a gate resistor 11a and a gate power-supply 12 for applying a voltage to the junction FET 1.

In the normally-off junction FET 1, a parasite diode 9 exists in parallel to an input capacitor 8. Accordingly, if, as illustrated in FIG. 3, a voltage which is higher than the rise-up voltage of the parasite diode 9 is applied between the gate and the source, a current is caused to start flowing through the input capacitor 8. This current turns on the junction FET 1. Also, the application of the voltage higher than the rise-up voltage causes a redundant gate current to flow. As a result, power consumption by the gate driver circuit 3 increases. In view of this situation, as illustrated in FIG. 2, the output voltage from the gate driver circuit 3 at the time of turn-on is controlled into a range of 2.5 V to 3.5 V. This control makes it possible to solve the above-described problems.

<<Embodiment 2>>

Figure 5:
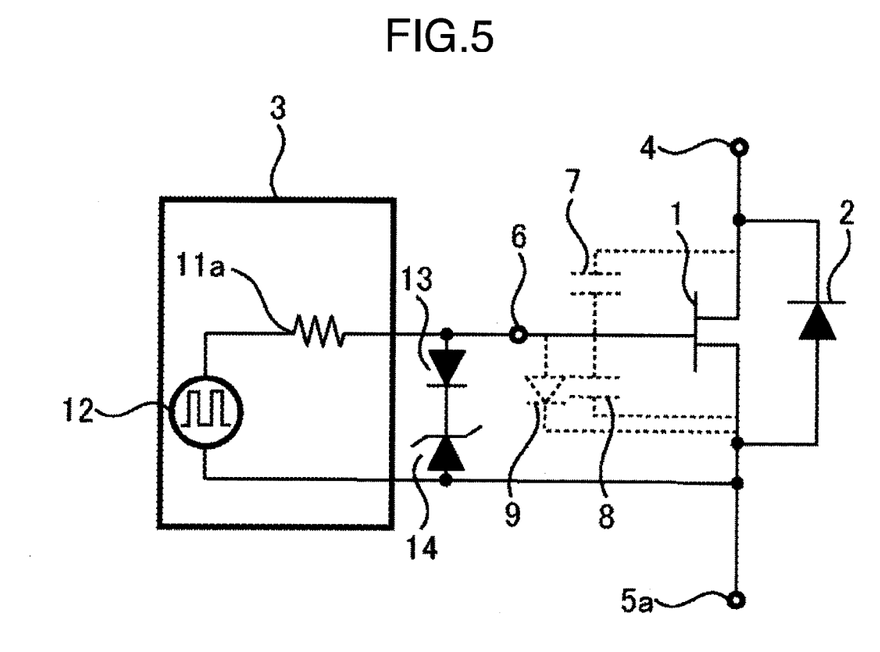
FIG. 5 is an explanatory diagram for explaining a semiconductor driver circuit in a second embodiment.

FIG. 5 illustrates another embodiment of the present invention. The configuration of the present embodiment is as follows: A diode 13 and a Zener diode 14 are connected between the gate terminal 6 and the source terminal 5 illustrated in FIG. 1. This connection allows the inter-gate-source voltage to be controlled with a high accuracy. Also, the connection of the diode 13 makes it possible to prevent occurrence of the discharging from the input capacitor 8 via the Zener diode 14 at the time of turn-off The employment of the above-described configuration permits the gate current at the time of turn-off to flow via the gate resistor 11a. Consequently, it becomes possible to adjust the turn-off speed by the magnitude of resistance value of 11a.

Also, a high voltage accuracy is not requested for the gate power-supply 12. Also, it becomes possible to apply, as the voltage of the gate power-supply 12, a voltage which is sufficiently larger than the threshold value. As a result, it becomes possible to flow the large gate current at the time of switching-start. This feature makes it possible to heighten the turn-on speed, and to reduce the turn-on loss.

<<Embodiment 3>>

Figure 6:
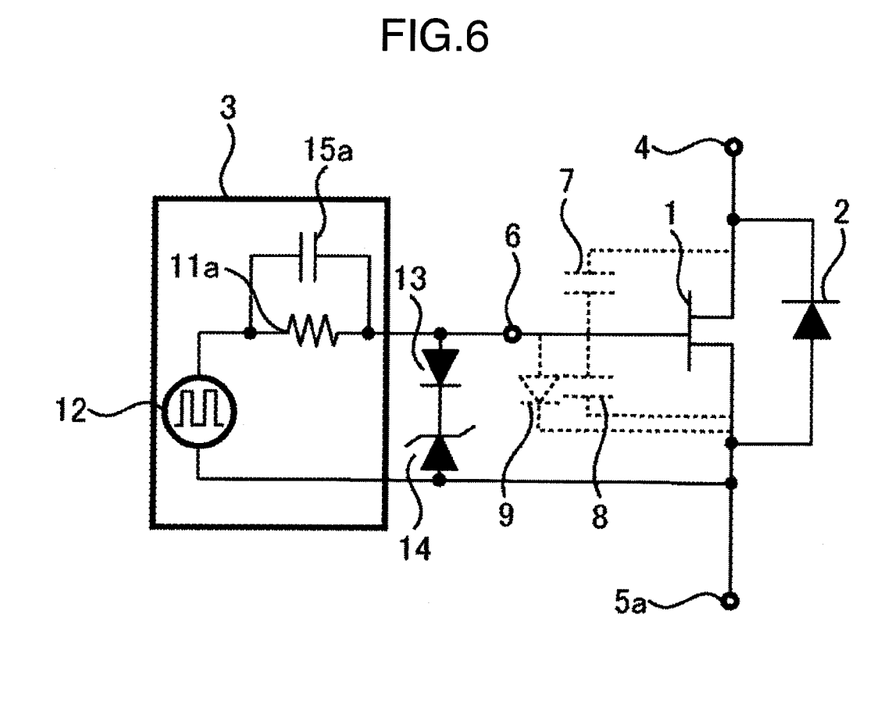
FIG. 6 is an explanatory diagram for explaining a semiconductor driver circuit in a third embodiment.

FIG. 6 illustrates another embodiment of the present invention. The configuration of the present embodiment is as follows: A capacitor 15a is connected to the circuit diagram illustrated in FIG. 5 in parallel to the gate resistor 11a within the circuit diagram.

The threshold value for the normally-off junction FET 1 is equal to 2.5 V, which is a low value. Also, the gate resistor 11a limits the gate current. These two factors have made it impossible to turn on the junction FET 1 at a high speed. In view of this situation, connecting the capacitor 15a permits the charging current into the input capacitor 8 to flow through the route that is different from the gate resistor 11a. This method allows implementation of the high-speed turn-on operation. Also, the gate resistor 11a makes it possible to limit the current at the time of turn-on.

Meanwhile, the capacitor 15a is charged at the time of turn-on. Accordingly, at the time of turn-off, the voltage of the capacitor 15a is applied between the gate and the source. This situation turns out to be a condition which is unlikely to give rise to the occurrence of a misoperation.

<<Embodiment 4>>

Figure 7:
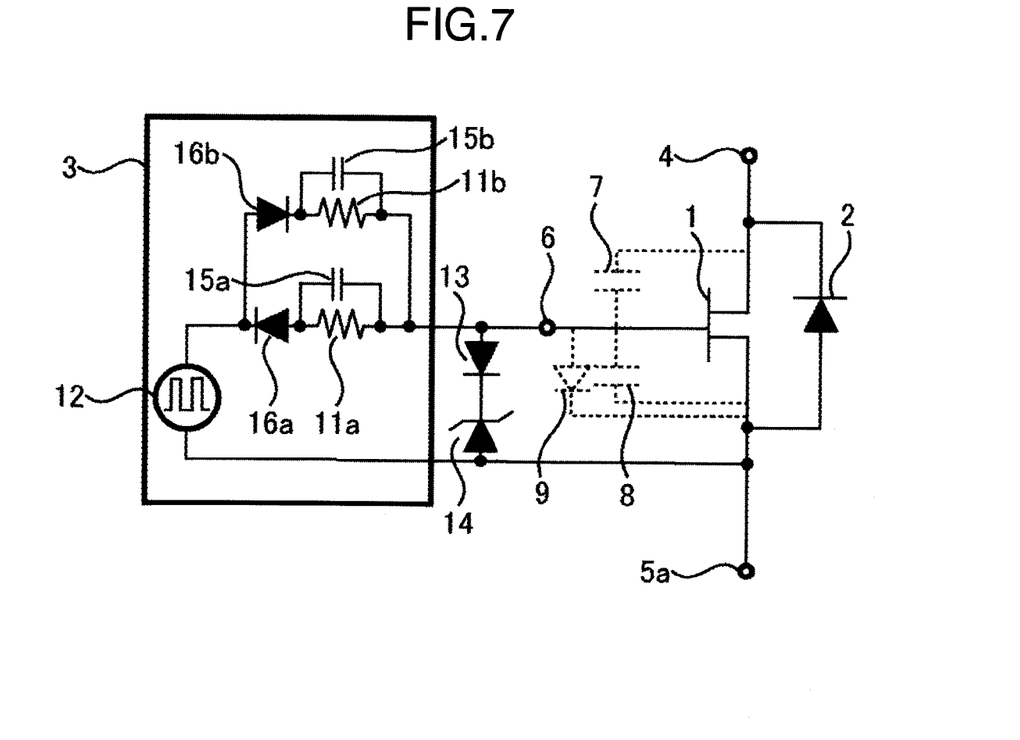
FIG. 7 is an explanatory diagram for explaining a semiconductor driver circuit in a fourth embodiment.

FIG. 7 illustrates another embodiment of the present invention. The configuration of the present embodiment is as follows: A diode 16a, a diode 16b, a capacitor 15b, and a gate resistor 11b are connected to the circuit diagram illustrated in FIG. 6. Namely, this configuration becomes a one where the route for the gate current is made different between the turn-on time and the turn-off time. The employment of the configuration like this makes it possible to freely change the speeds at the turn-on time and the turn-off time.

<<Embodiment 5>>

Figure 8:
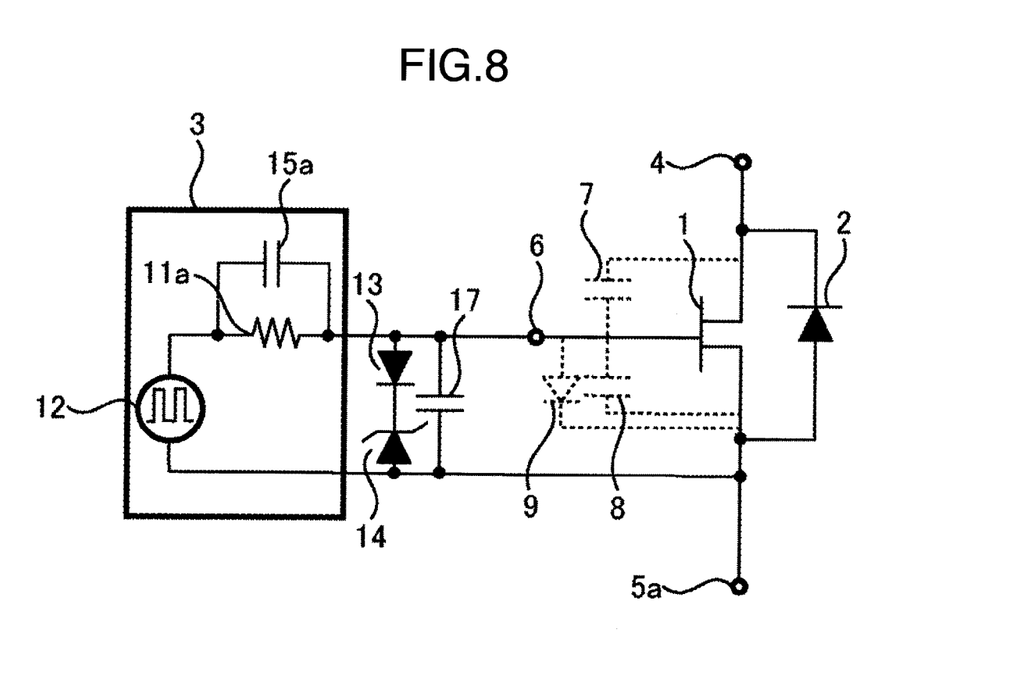
FIG. 8 is an explanatory diagram for explaining a semiconductor driver circuit in a fifth embodiment.

FIG. 8 illustrates another embodiment of the present invention. The configuration of the present embodiment is as follows: A capacitor 17 is connected to the circuit diagram illustrated in FIG. 6. In the case of such a circuit as an inverter which has switching elements in its upper and lower arms, if, e.g., the switching element of the upper arm is turned on, the power-supply voltage of the inverter is applied to the switching element of the lower arm in the turn-off state. At this time, an input capacitor of the lower arm is charged via a feedback capacitor of the lower arm. This charging gives rise to the generation of a pop-up voltage between the gate and the source, thereby giving rise to the occurrence of a misoperation.

Moreover, the speeding-up implementation of the turn-on operation is accomplished to speed up a change in the voltage. This state raises the pop-up voltage, thus turning out to be a condition which is likely to give rise to the occurrence of the misoperation. In view of this situation, the capacitor 17 is connected in parallel to the input capacitor 8. The pop-up voltage is generally determined by a voltage-division ratio between a feedback capacitor 7 and the input capacitor 8. Accordingly, the employment of the above-described circuit configuration makes it possible to suppress the pop-up voltage. As a result, the previous configuration becomes a one which is unlikely to give rise to the occurrence of the misoperation.

<<Embodiment 6>>

Figure 9:
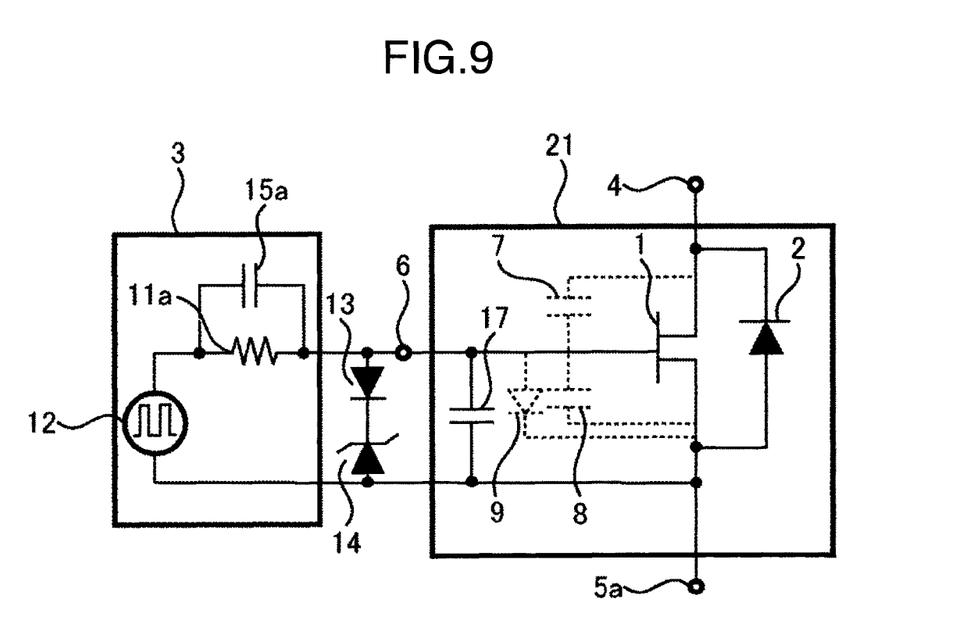
FIG. 9 is an explanatory diagram for explaining a semiconductor driver circuit in a sixth embodiment.

FIG. 9 illustrates another embodiment of the present invention. The scheme of the present embodiment is as follows: The capacitor 17 illustrated in FIG. 8 is implemented inside a package in which the junction FET 1 is implemented. The employment of the implementation like this results in the implementation of a configuration which is unlikely to undergo the influence of an inductance between the capacitor 17 and the gate terminal of the junction FET 1, and which is even unlikelier to give rise to the occurrence of the misoperation as compared with the circuit illustrated in FIG. 8.

<<Embodiment 7>>

Figure 10:
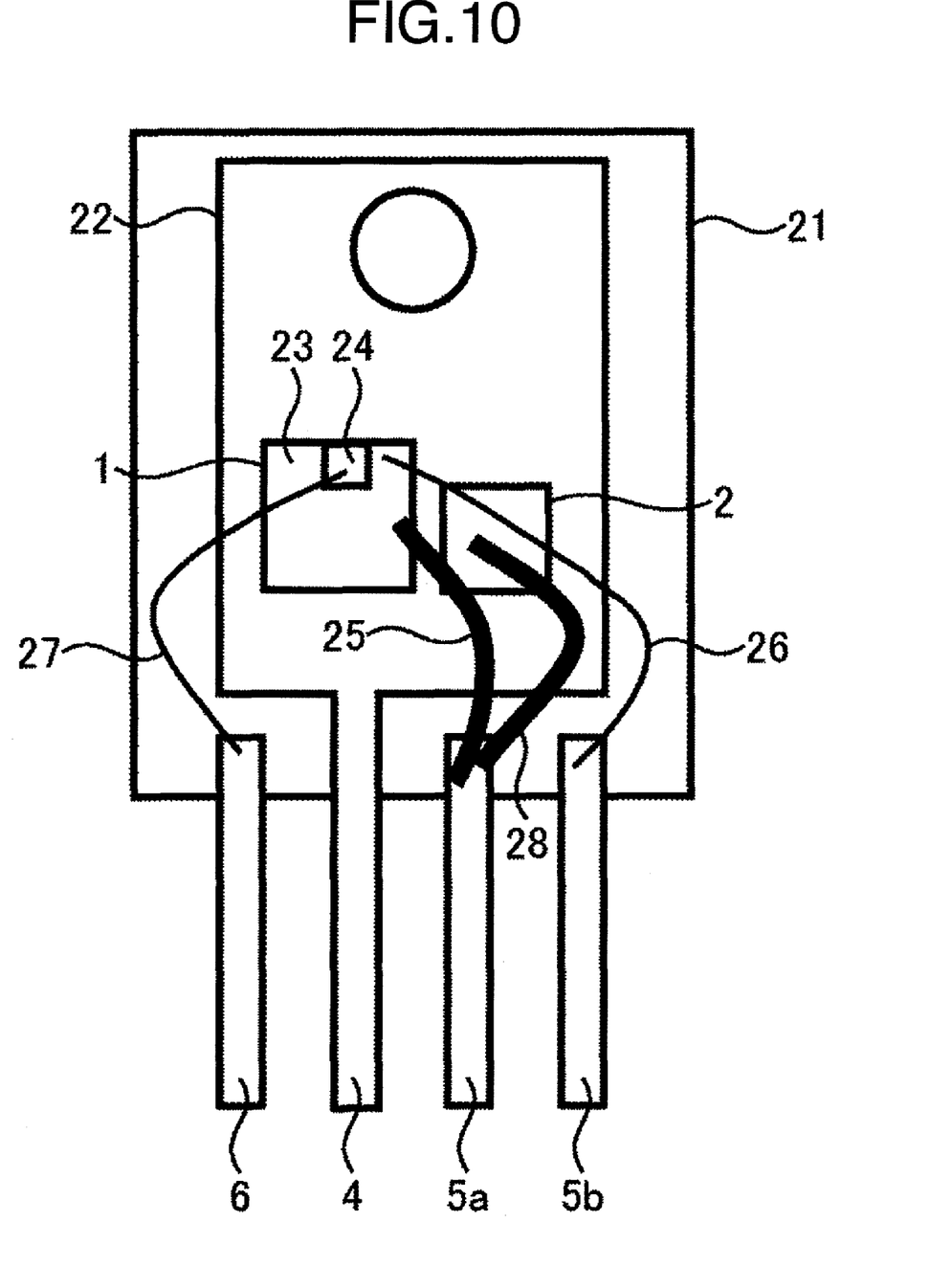
FIG. 10 is an explanatory diagram for explaining a semiconductor driver circuit in a seventh embodiment.
Figure 11:
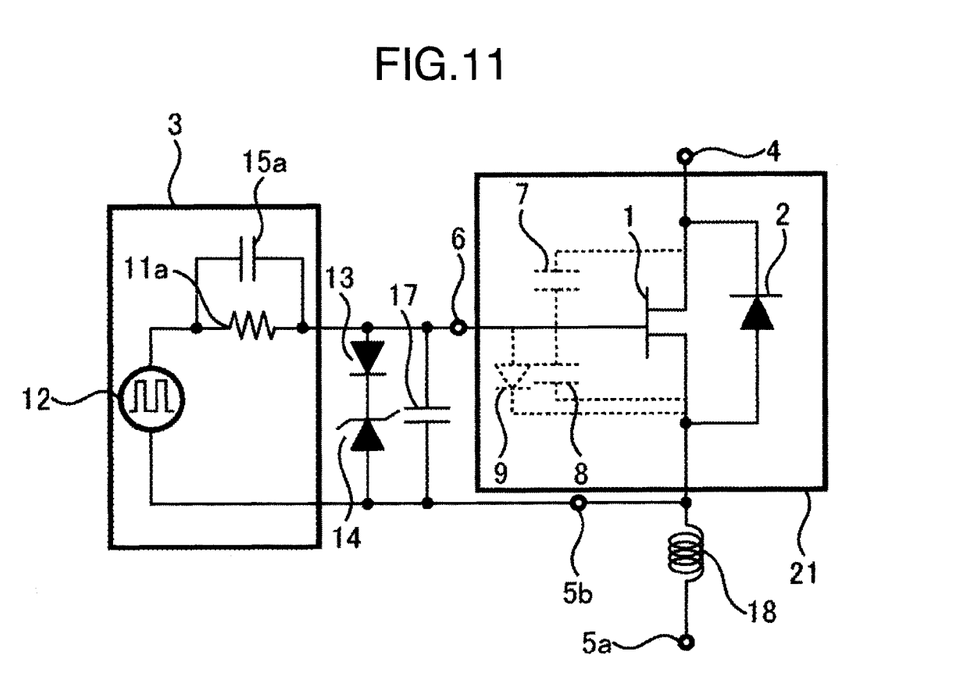
FIG. 11 is a diagram for illustrating the semiconductor driver circuit in the case where the seventh embodiment is applied to the fifth embodiment.

FIG. 10 illustrates another embodiment of the present invention. FIG. 11 illustrates a circuit diagram in a case where the implementation scheme illustrated in FIG. 10 is applied to the circuit illustrated in FIG. 8.

The configuration of the present embodiment is as follows: The junction FET 1 and the diode 2 are implemented on an implementation substrate 22 inside the package 21. In the junction FET 1, the connection ranging from a gate electrode 24 to the gate terminal 6 is established via a gate wiring 27. The connection ranging from a source electrode 23 to the source terminal 5a is established via a main-circuit-dedicated source wiring 25. The connection ranging from the source electrode 23 to a source terminal 5b is established via a gate-driver-circuit-dedicated source wiring 26. The connection ranging from the freewheel diode to the source terminal 5a is established via a diode wiring 28. Also, in the case where the implementation scheme illustrated in FIG. 10 is used, as illustrated in FIG. 11, the gate terminal 6 and the source terminal 5b are connected to the gate driver circuit 3.

The employment of the configuration as described above makes it possible to implement the route for a main-circuit current and the route for the gate current in such a manner that these routes are made different from each other. Here, the main-circuit current flows from the drain terminal 4 to the source terminal 5a, and the gate current flows from the gate driver circuit 3.

In the conventional technologies, when the main-circuit current flows through the inductance 18 of the source wiring, the inductance 18 results in the generation of a voltage. Then, if this voltage has exceeded its threshold value, the misoperation is caused to occur. The employment of the configuration illustrated in FIG. 10, however, almost completely prevents the main-circuit current from flowing through the wiring between the gate terminal 6 and the source terminal 5b. Consequently, it becomes possible to suppress a rise in the voltage due to the inductance. As a result, the previous configuration becomes a one which is unlikely to give rise to the occurrence of the misoperation.

According to the present invention, it becomes possible to provide the semiconductor driver circuit for preventing the misoperations from occurring as much as possible, and allowing implementation of the low-loss driving even in the case where the normally-off junction FET is used, and the semiconductor device using this semiconductor driver circuit.

It should be further understood by those skilled in the art that although the foregoing description has been made on embodiments of the invention, the invention is not limited thereto and various changes and modification may be made without departing from the spirit of the invention and the scope of the appended claims.

The invention claimed is:

1. A device circuit for switching device, comprising:
   a semiconductor switching element including a drain terminal, a source terminal, and a gate terminal;
   a gate driver circuit for controlling voltages of said source terminal and said gate terminal of said semiconductor switching element; and
   a Zener diode and a diode provided between said source terminal and said gate terminal, said Zener diode and said diode being connected to each other in series; and
   wherein an anode terminal of said Zener diode is connected to said source terminal, and an anode terminal of said diode is connected to said gate terminal,
   wherein the semiconductor switching element comprises a junction FET including an input capacitor and a parasite diode in parallel to the input capacitor between the gate and source terminals; and
   wherein a reverse-blocking voltage of said Zener diode is equal to 2V or more.

2. A device circuit for switching device, comprising:
   a semiconductor switching element including a drain terminal, a source terminal, and a gate terminal; and
   a gate driver circuit for controlling voltages of said source terminal and said gate terminal of said semiconductor switching element,
   wherein said gate driver circuit controls a voltage into a range of 2.5 V to 3.5 V, said voltages being applied between said gate terminal and said source terminal when said semiconductor switching element is turned on by said gate driver circuit,
   the circuit further comprising:
   a gate resistor for adjusting speeds of turn-on and turn-off of said semiconductor switching element being provided inside said gate driver circuit;
   a first capacitor being connected to said gate resistor in parallel thereto; and
   a capacitance value of said first capacitor being larger than a capacitance value of an input capacitor of said semiconductor switching element.

3. The circuit according to claim 2, wherein a magnitude of resistance value of said gate resistor and magnitude of said capacitance value of said first capacitor are changed between turn-on time and turn-off time of said semiconductor switching element.

4. The circuit according to claim 3, wherein a second capacitor is provided between said source terminal and said gate terminal.

5. A semiconductor device, comprising:
   a substrate, the circuit according to claim 4 and said semiconductor switching element being implemented on said substrate; and
   a package for said substrate,
   wherein said second capacitor is implemented on said substrate.

6. A device circuit for switching device, comprising:
a semiconductor switching element including a drain terminal, a source terminal, and a gate terminal;
a gate driver circuit for controlling voltages of said source terminal and said gate terminal of said semiconductor switching element; and
a Zener diode and a diode provided between said source terminal and said gate terminal, said Zener diode and said diode being connected to each other in series;
an anode terminal of said Zener diode being connected to said source terminal, and an anode terminal of said diode being connected to said gate terminal;
a gate resistor for adjusting speeds of turn-on and turn-off of said semiconductor switching element being provided inside said gate driver circuit; and
a first capacitor being connected to said gate resistor in parallel thereto; and
a capacitance value of said first capacitor being larger than a capacitance value of an input capacitor of said semiconductor switching element.

7. The circuit according to claim 6, wherein a magnitude of resistance value of said gate resistor and magnitude of said capacitance value of said first capacitor are changed between turn-on time and turn-off time of said semiconductor switching element.

8. The circuit according to claim 7, wherein a second capacitor is provided between said source terminal and said gate terminal.

9. A semiconductor device, comprising:
a substrate, the circuit according to claim 8 and said semiconductor switching element being implemented on said substrate; and
a package for said substrate,
wherein said second capacitor is implemented on said substrate.

* * * * *